(12) United States Patent
Hiramatsu et al.

(10) Patent No.: US 6,844,574 B1
(45) Date of Patent: Jan. 18, 2005

(54) III-V COMPOUND SEMICONDUCTOR

(75) Inventors: Kazumasa Hiramatsu, Yokkaichi (JP); Hideto Miyake, Hisai (JP); Takayoshi Maeda, Nabari (JP); Yasushi Iyechika, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/522,707

(22) Filed: Mar. 10, 2000

Related U.S. Application Data

(63) Continuation-in-part of application No. 09/396,942, filed on Sep. 15, 1999.

(30) Foreign Application Priority Data

| Mar. 12, 1999 | (JP) | 11-066743 |
|---|---|---|
| Aug. 24, 1999 | (JP) | 11-236979 |
| Feb. 10, 2000 | (JP) | 2000-033293 |

(51) Int. Cl.$^7$ .............................................. H01L 29/04
(52) U.S. Cl. ...................................... 257/190; 428/698
(58) Field of Search ........................... 257/190, 98, 99; 428/642, 698

(56) References Cited

U.S. PATENT DOCUMENTS

| 5,828,088 A | * | 10/1998 | Mauk ........................... 257/98 |
| 5,874,747 A | * | 2/1999 | Redwing et al. ............... 257/77 |
| 5,880,485 A | * | 3/1999 | Marx et al. .................... 257/94 |
| 6,051,849 A | * | 4/2000 | Davis et al. .................. 257/103 |
| 6,153,010 A | * | 11/2000 | Kiyoku et al. ................. 117/95 |
| 6,177,688 B1 | * | 1/2001 | Linthicum et al. ............. 257/77 |
| 6,325,850 B1 | * | 12/2001 | Beaumont et al. ............. 117/95 |

FOREIGN PATENT DOCUMENTS

| EP | 0 264 457 A | 4/1988 |
| EP | 0 299 558 A | 1/1989 |
| EP | 0 330 217 A | 8/1989 |
| EP | 0 417 785 A | 3/1991 |
| EP | 0 497 103 A | 8/1992 |
| EP | 0 855 446 A | 7/1998 |

OTHER PUBLICATIONS

Nakamura et al., "Long lifetime violet InGaN/GaNAlGaN–based semiconductor lasers," May 28, 1998, pp. 52–58.*

Yu, et al., "Study of the epitaxial–lateral–overgrowth (ELOO process for GaN on sapphire," Journal of Crystal Growth 195 (1998) 333–339.*

Sakai et al., "Defect structure in selectively grown GaN films with low threading dislocation density," Appl. Phys. Lett. 71 (1–6) Oct. 20, 1997, pp. 2259–2261.*

Wong et al., "Damage–free separation of GaN thin films from sapphire substrates," Appl. Phys. Lett. 72 (5), Feb. 2, 1998, pp. 599–601.*

Jones et al., "Characterisitcs of GaN Stripes Grown by Selective–Area Metalorganic Chemical Vapor Deposition," Journal of Electronic Materials, vol. 26, No. 3, 1997, pp. 306–310.*

Schlachter, A. et al., Journal of Biotechnology, vol. 62, No. 1, pp. 47–54, 1998.

* cited by examiner

Primary Examiner—Bradley Baumeister
(74) Attorney, Agent, or Firm—Birch, Stewart, Kolasch & Birch, LLP

(57) ABSTRACT

Provided is a III–V compound semiconductor having a layer formed from a first III–V compound semiconductor expressed by the general formula $In_uGa_vAl_wN$ (where $0 \leq u \leq 1$, $0 \leq v \leq 1$, $0 \leq w \leq 1$, $u+v+w=1$), a pattern formed on the layer from a material different not only from the first III–V compound semiconductor but also from a second III–V compound semiconductor hereinafter described, and a layer formed on the first III–V compound semiconductor and the pattern from the second III–V compound semiconductor expressed by the general formula $In_xGa_yAl_zN$ (where $0 \leq x \leq 1$, $0 \leq y \leq 1$, $0 \leq x \leq 1$, $x+y+z=1$), wherein the full width at half maximum of the (0004) reflection X-ray rocking curve of the second III–V compound semiconductor is 700 seconds or less regardless of the direction of X-ray incidence. In the III–V compound semiconductor, which is a high quality semiconductor, the occurrence of low angle grain boundaries is suppressed.

10 Claims, 2 Drawing Sheets

III-V COMPOUND SEMICONDUCTOR

This application is a continuation-in-part of application Ser. No. 09/396,942 filed on Sep. 15, 1999, the entire contents of which are hereby incorporated by reference.

BACKGROUND OF THE INVENTION

1. Field of the Invention

The present invention relates to a III–V compound semiconductor expressed by the general formula $In_aGa_bAl_cN$ (where a+b+c=1, $0 \leq a \leq 1$, $0 \leq b \leq 1$, $0 \leq c \leq 1$).

2. Description of the Related Art

III–V compound semiconductors expressed by the general formula $In_aGa_bAl_cN$ (where a+b+c=1, $0 \leq a \leq 1$, $0 \leq b \leq 1$, $0 \leq c \leq 1$) can be used as materials for high efficient light emitting devices ranging from the ultraviolet to the visible region of the electromagnetic spectrum, since their direct band gap corresponding to ultraviolet to red is adjustable by varying the composition of the group III elements. Furthermore, since these compound semiconductors have a large band gap compared with commonly used semiconductors such as Si and GaAs, in theory it is possible to fabricate electronic devices having excellent environmental resistance by utilizing the characteristic that they can retain the property as semiconductors at such high temperatures that make conventional semiconductors inoperable.

In the case of such compound semiconductors, however, since it is extremely difficult to grow a large crystal because of their very high vapor pressure near the melting point, it is not possible to obtain a crystal of practical size that can be used as the substrate for semiconductor device fabrication. Accordingly, in the fabrication of the compound semiconductor, usually sapphire, SiC, or other material having a similar crystal structure to that of the compound semiconductor, and capable of producing a large crystal, is used as the substrate on top of which the compound semiconductor is epitaxially grown. Using such a method, it has become possible to obtain a crystal of the compound semiconductor of relatively good quality. Even then, it is difficult to reduce crystal defects resulting from the difference in lattice constant or thermal expansion coefficient between the substrate material and the compound semiconductor, and a defect density of about $10^8 cm^{-2}$ or more usually results.

On the other hand, there has been reported a technique for obtaining a compound semiconductor with reduced defect density, using as the base the compound semiconductor having a high crystal defect density such as described above (Jpn. J. Appl. Phys., Vol. 36, page L899, 1997). That is, the high defect density compound semiconductor (hereinafter sometimes called the base crystal) is covered with a $SiO_2$ pattern, leaving therein microscopic openings, and a second crystal growth is performed on top of that (hereinafter, the second crystal growth may be called the regrowth). An outline of this method will be described with reference to FIG. 1.

First, in the early stage of the regrowth, no crystal growth occurs on the pattern, but crystal growth occurs only in the openings, that is, selective growth occurs. When the crystal growth further continues from this stage, the crystal grown in each opening spreads over the pattern, resulting in a structure burying the pattern therebelow. Though steps remain on the regrown crystal surface immediately after the pattern burying, the steps on the regrown surface are gradually smoothed as the crystal growth progresses and, finally, a flat crystal surface can be obtained.

So far, the following two methods are reported as viable methods for reducing crystal defects in the compound semiconductor by the fabrication of the above-described buried structure. The two methods are a hydride vapor phase epitaxy method (hereinafter sometimes called the HVPE method) and a metal organic vapor phase epitaxy method (hereinafter sometimes called the MOVPE method). These methods, however, have involved the following problems.

First, in the case of the HVPE method, it is known that the compound semiconductor grown over the pattern is oriented at a slightly different angle than the base crystal while the crystal grown over the opening has the crystal orientation aligned with that of the base crystal (Appl. Phys. Lett., Vol. 73, page 481, 1998). Accordingly, the crystal grown over the pattern and the crystal grown over the opening are not aligned in crystal orientation, their interface forming a so-called low angle grain boundary where many edge dislocations are contained. As the regrown crystal increases in thickness, the crystal orientation gradually aligns, but the film thickness where edge dislocations do not occur is required to be about 60 µm or greater. Growing such a thick film not only consumes much time, but also involves the problem that the distortion due to the difference in thermal expansion coefficient between the regrown crystal and the substrate crystal increases. The internal distortion of the substrate causes deformation of the substrate, which in turn causes a problem in crystal growth and, hence, a fabrication problem in the usual semiconductor process.

An object of the present invention is to provide a III–V compound semiconductor in which the occurrence of low angle grain boundaries is suppressed.

SUMMARY OF THE INVENTION

The present invention concerns (1) a III–V compound semiconductor having a layer formed from a first III–V compound semiconductor expressed by the general formula $In_uGa_vAl_wN$ (where $0 \leq u \leq 1$, $0 \leq v \leq 1$, $0 \leq w \leq 1$, u+v+w=1), a pattern formed on the layer from a material different not only from the first III–V compound semiconductor but also from a second III–V compound semiconductor hereinafter described, and a layer formed on the first III–V compound semiconductor and the pattern from the second III–V compound semiconductor expressed by the general formula $In_xGa_yAl_zN$ (where $0 \leq x \leq 1$, $0 \leq y \leq 1$, $0 \leq z \leq 1$, x+y+z=1), wherein the full width at half maximum of the (0004) reflection X-ray rocking curve of the second III–V compound semiconductor is 700 seconds or less regardless of the direction of X-ray incidence.

The invention also concerns (2) a III–V compound semiconductor having a layer formed from a first III–V compound semiconductor expressed by the general formula $In_uGa_vAl_wN$ (where $0 \leq u \leq 1$, $0 \leq v \leq 1$, $0 \leq w \leq 1$, u+v+w=1), a pattern formed on the layer from a material different not only from the first III–V compound semiconductor but also from a second III–V compound semiconductor hereinafter described, and a layer formed on the first III–V compound semiconductor and the pattern from the second III–V compound semiconductor expressed by the general formula $In_xGa_yAl_zN$ (where $0 \leq x \leq 1$, $0 \leq y \leq 1$, $0 \leq z \leq 1$, x+y+z=1), wherein an upper surface of the pattern is not in contact with the second III–V compound semiconductor.

Further, the invention concerns a III–V compound semiconductor as described in (1) or (2), wherein the pattern is formed from W (tungsten). Exemplary of semiconductor devices encompassed by the present invention and electronic devices that can contain the same, but not being limited thereto, are light emitting diodes (LED), laser diodes (LD), and the like.

Figure 1:
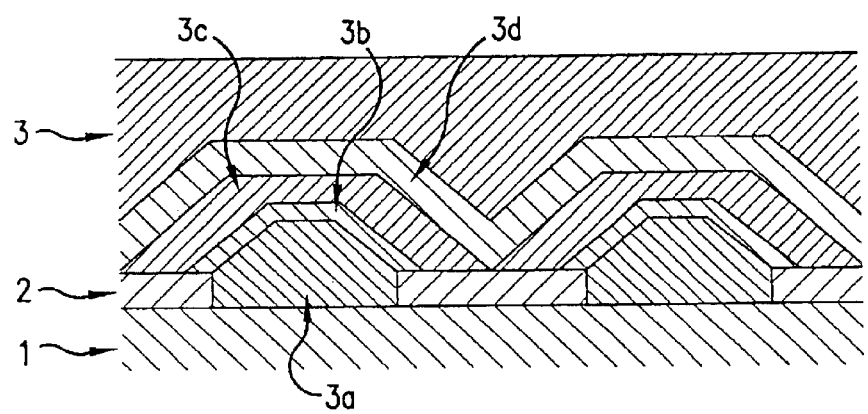
FIG. 1 is a cross-sectional view showing how regrowth proceeds on a pattern according to the prior art.

The denotations used in FIG. 1 are as follows.

1: a layer (base layer) formed from first III–V compound semiconductor made of high crystal defect density compound semiconductor 2: a pattern formed from material different from first and second III–V compound semiconductors made of, for example, $SiO_2$ 3: a crystal layer (regrown layer) formed from second III–V compound semiconductor wherein the crystal layer has flattened out.

3a): a selective growth in microscopic opening

3b): crystal growth beginning to spread over the second III–V compound semiconductor 3c): crystal growth further spreading out over the second III–V compound semiconductor 3d): crystal growth, which has completely grown over the second III–V compound semiconductor.

DETAILED DESCRIPTION OF THE INVENTION

The III–V compound semiconductor utilized in the semiconductor of the present invention is characterized in that the full width at half maximum of the (0004) reflection X-ray rocking curve of the second III–V compound semiconductor is 700 seconds or less regardless of the direction of X-ray incidence.

Further, the present invention is characterized in that the upper surface of the pattern formed from a material different from the first III–V compound semiconductor and the second III–V compound semiconductor has almost no contact with the crystal grown over the pattern. Though the reason is not clear at present, it is believed that the occurrence of low angle grain boundaries is suppressed when the pattern does not contact the crystal regrown over it.

In some previous examples, voids were formed on the pattern, creating a gap between the pattern and the regrown layer, but even in such cases, voids are formed after the so-called overgrowth, i.e., after the regrown layer is more or less overgrown to contact the pattern. By contrast, the present invention is characterized in that overgrowth of the regrown layer is almost not observed on the pattern.

A more specific description of the present invention will be given below.

Materials having a certain degree of durability during the regrowth of the compound semiconductor are preferable for use as the material for the pattern used in the present invention. That is, if the material vanishes by evaporation or is deformed by melting in the regrowth atmosphere or at the regrowth temperature before starting regrowth on the sample with the pattern formed thereon, it is difficult to perform the intended regrowth with good reproducibility. However, since the regrown layer is not overgrown on the pattern of the present invention, roughing of the pattern surface, separation from the base layer, etc. do not occur at least during the early stage of the regrowth, and the effect of the present invention may not be impaired significantly.

More specifically, the sample is exposed to an atmosphere such as ammonium during the regrowth, and materials that can be used under such conditions include such elements as W (tungsten), Re (rhenium), Mo (molybdenum), Cr (chromium), Co (cobalt), Si (silicon), gold, Zr (zirconium) Ta (tantalum), Ti (titanium), Nb (niobium), nickel, platinum, V (vanadium), Hf (hafnium), and Pd (palladium), and such compounds as BN (boron nitride) and $SiN_x$ (silicon nitride) including such as $Si_3N_4$, and nitrides such as tungsten nitride, titanium nitride, zirconium nitride, hafnium nitride, vanadium nitride, niobium nitride, tantalum nitride, chromium nitride, molybdenum nitride, rhenium nitride, iron nitride.

A pattern of a lamination of at least two layers where contacting layers in the lamination are made of different materials from each other may be used in the present invention. Specifically, a pattern of a lamination which includes a layer made of W and a layer made of a material other than W may be used. Further, materials with which it is not easy to fabricate the structure of the present invention, such as $SiO_2$, or which is not stable under the regrowth conditions may be used as a material of a layer in the lamination which is different from W.

Prior known pattern geometries can be used for the pattern of the present invention. Specific examples include a pattern generally called the line/space pattern in which stripes of a predetermined width are arranged parallel to each other, one separated from another by an opening of a predetermined width, and a pattern that partially exposes the base layer through circular or polygonal openings. These pattern geometries can be selected for use by considering the regrowth conditions, pattern material, etc.

In the case of the line/space pattern, the pattern width is preferably not smaller than 0.05 μm and not larger than 20 μm. If the pattern width is smaller than 0.05 μm, the effect of the invention for reducing the defect density is not sufficient. On the other hand, if it is larger than 20 μm, the time required to bury the pattern becomes too long and is not practicable. For the same reason, in the case of the pattern having circular or polygonal openings, the distance between openings is preferably not smaller than 0.05 μm and not larger than 20 μm.

In the case of the line/space pattern, the width of the space (the opening through which the base layer is exposed) is preferably not smaller than 0.01 μm and not larger than 20 μm. If the space width is smaller than 0.01 μm, with the current semiconductor process it is difficult to produce a practicably accurate shape, which is not desirable. On the other hand, if it is larger than 20 μm, the effect of the invention for reducing defects is not sufficient. For the same reason, in the case of the pattern having circular or polygonal openings, the opening size is preferably not smaller than 0.01 μm and not larger than 20 μm.

In the case of the line/space pattern geometry, the stripe direction is not specifically limited, but there are cases in which the effect of defect reduction by the regrowth varies depending on the stripe direction. In such cases, an appropriate direction can be selected by considering the pattern geometry, pattern material, regrowth conditions, etc.

Known techniques such as evaporation, sputtering, chemical vapor deposition (CVD), or plating can be used for the formation of the pattern. Also the pattern of a compound material can be formed by chemical reaction of a film formed prior to the chemical reaction. An example of this technique is to form a tungsten nitride film by annealing a tungsten film in an atmosphere including ammonia. The film thickness of the pattern can be determined by considering practical durability and productivity. In the case of W, the thickness is not smaller than 2 nm and not greater than 5 μm.

The HVPE method or the MOVPE method can be employed as the method of crystal growth used for the regrowth in the present invention. The HVPE method can be used advantageously in the prevent invention since it can provide a high growth rate and can produce a good crystal in a short period of time. The MOVPE method can also be used advantageously in the present invention since uniform crystal growth can be performed on a large number of substrates.

The conditions for the regrowth include temperature, pressure, carrier gas, and raw material. Known conditions can be used for the regrowth. More specifically, if In is not contained as a constituent element, the regrowth temperature is preferably not lower than 600° C. and not higher than 1200° C., though it depends on the properties of the compound semiconductor to be grown. If the regrowth temperature is lower than 600° C. or higher than 1200° C., it is difficult to obtain a good crystal by regrowth. Further, if the compound semiconductor contains In as a constituent element, since its thermal stability degrades, the regrowth temperature is preferably not lower than 600° C. and not higher than 900° C.

The growth pressure that can be used for the regrowth in the present invention is not lower than 100 Pa. If the pressure for the regrowth is lower than 100 Pa, it is difficult to obtain a good crystal. The pressure is preferably 500 Pa or higher, and more preferably 1000 Pa or higher. Crystallinity tends to improve as the growth pressure increases, but generally, MOVPE equipment or HVPE equipment used for crystal growth is industrially not used with very high growth pressures; therefore, the growth pressure for the regrowth is preferably 10 atmospheres or lower.

Carrier gases that can be used for the regrowth in the present invention includes hydrogen, nitrogen, helium, argon, etc. which are conventionally used in MOVPE or HVPE.

The following raw materials can be used for the fabrication of the III–V compound semiconductor of the present invention, by the MOVPE method., Group III materials that can be used include: trialkyl gallium expressed by the general formula $R_1R_2R_3Ga$ (where $R_1$, $R_2$, and $R_3$ denote lower alkyl radicals), such as trimethyl gallium [$(CH_3)_3Ga$, hereinafter sometimes designated as TMG] and triethyl gallium [$(C_2H_5)_3Ga$, hereinafter sometimes designated as TEG]; trialkyl aluminum expressed by the general formula $R_1R_2R_3Al$ (where $R_1$, $R_2$, and $R_3$ denote lower alkyl radicals), such as trimethyl aluminum [$(CH_3)_3Al$] and triethyl aluminum [$(C_2H_5)_3Al$, hereinafter sometimes designated as TEA]; trimethylaminealane [$(CH_3)_3N: AlH_3$]; and trialkyl indium expressed by the general formula $R_1R_2R_3In$ (where $R_1$, $R_2$, and $R_3$ denote lower alkyl radicals), such as trimethyl indium [$(CH_3)_3In$, hereinafter sometimes designated as TMI] and triethyl indium [$(C_2H_5)_3In$]. These materials are used alone or in combinations thereof.

Group V materials include, for example, ammonium, hydrazine, methylhydrazine, 1,1-dimethylhydrazine, 1,2-dimethylhydrazine, t-butylamine, and ethylenediamine. These materials are used alone or in combinations thereof. Of these materials, ammonium and hydrazine are advantageous since these elements do not contain carbon atoms and therefore minimize carbon contamination of the semiconductor, and ammonium is the more preferable because of ease of handling.

Si, Ge, or O is used as the n-type dopant for the III–V compound semiconductor. Of these dopants, Si is preferable, since it is easy to make a low resistance n-type material and since a raw material of high purity can be obtained. Raw materials that can be used for Si doping include, for example, silane ($SiH_4$), disilane ($Si_2H_6$), and monomethylsilane ($Si(CH_3)H_3$)

The following raw materials can be used for the fabrication of the III–V compound semiconductor of the instant invention, by the HVPE method.

As the group III materials, GaCl and InCl can be produced by making a hydrogen chloride gas react with metals Ga and In, respectively. GaCl and InCl can also be produced by making a hydrogen chloride gas react at high temperatures with trialkyl gallium expressed by the general formula $R_1R_2R_3Ga$ (where $R_1$, $R_2$, and $R_3$ denote lower alkyl radicals), such as TMG or TEG, and trialkyl indium expressed by the general formula $R_1R_2R_3In$ (where $R_1$, $R_2$, and $R_3$ denote lower alkyl radicals), such as TMI or triethyl indium. Further, dimethyl gallium chloride ($Ga(CH_3)_2Cl$), diethyl gallium chloride ($Ga(C_2H_5)_2Cl$), dimethyl indium chloride ($In(CH_3)_2Cl$), diethyl indium chloride ($In(C_2H_5)_2Cl$), or the like may be decomposed at high temperatures to produce GaCl and InCl. It is also possible to supply carrier gas bubbles into $GaCl_2$, $InCl_2$, etc. which are stable at normal temperatures. These can be used alone or in combination thereof.

Group V materials include, for example, ammonium, hydrazine, methylhydrazine, 1,1-dimethylhydrazine, 1,2-dimethylhydrazine, t-butylamine, and ethylenediamine. These materials are used alone or in combinations thereof. Of these materials, ammonium and hydrazine are advantageous since these elements do not contain carbon atoms and therefore minimize carbon contamination of the semiconductor, and ammonium is the more preferable because of ease of handling.

Si, Ge, or O is used as the n-type dopant for the III–V compound semiconductor. Of these dopants, Si is preferable, since it is easy to make a low resistance n-type material and since a raw material of high purity can be obtained. Raw materials that can be used for Si doping include, for example, monochlorosilane ($SiH_3Cl$) and dichlorosilane ($SiH_2Cl_2$)

In the present invention, depending on the pattern making conditions and regrowth conditions, there can occur cases where a depression is formed in the surface of the layer of the first III–V compound semiconductor after the regrowth. There are cases where the formation of such a depression can be suppressed by using as the first III–V compound semiconductor a III–V compound semiconductor expressed by the general formula $In_uGa_vAl_wN$ ($0 \leq u \leq 1$, $0 \leq v \leq 1$, $0 \leq w \leq 1$, $u+v+w=1$). In specific terms, the AlN composition ratio (the value of w in the above general formula) is 1% or greater, and preferably 5% or greater. In specific terms, the thickness of the first III–V compound semiconductor layer is 0.3 nm or greater, and preferably 1 nm or greater. Generally, the effect of suppressing the formation of depressions during regrowth increases as the AlN composition ratio or the thickness of the first III–V compound semiconductor layer increases, but at the same time, the crystallinity of the first III–V compound semiconductor tends to decrease; therefore, the thickness of the first III–V compound semiconductor layer must be adjusted according to the AlN composition ratio.

EXAMPLES

Example 1, Comparative Example 1

First, the base crystal was prepared in the following manner. Using the MOVPE method, a buffer layer of GaN was grown at 550° C. to a thickness of 50 nm on a sapphire substrate, and GaN was further grown at about 1100° C. to a thickness of 4 μm. Then, W was deposited by sputtering to a thickness of 30 nm on the base crystal, and using conventional photolithography, a stripe pattern with 5-μm opening and 5-μm stripe was formed. The stripe direction was <1–100> direction. Next, using this crystal, regrowth was performed to a thickness of 33 μm using the HVPE method. Further, as a first Comparative Example, the pattern was formed using $SiO_2$ instead of W, and the regrowth was performed in the same manner. In either case, the crystal obtained by regrowth had a specular surface.

Figure 2A:
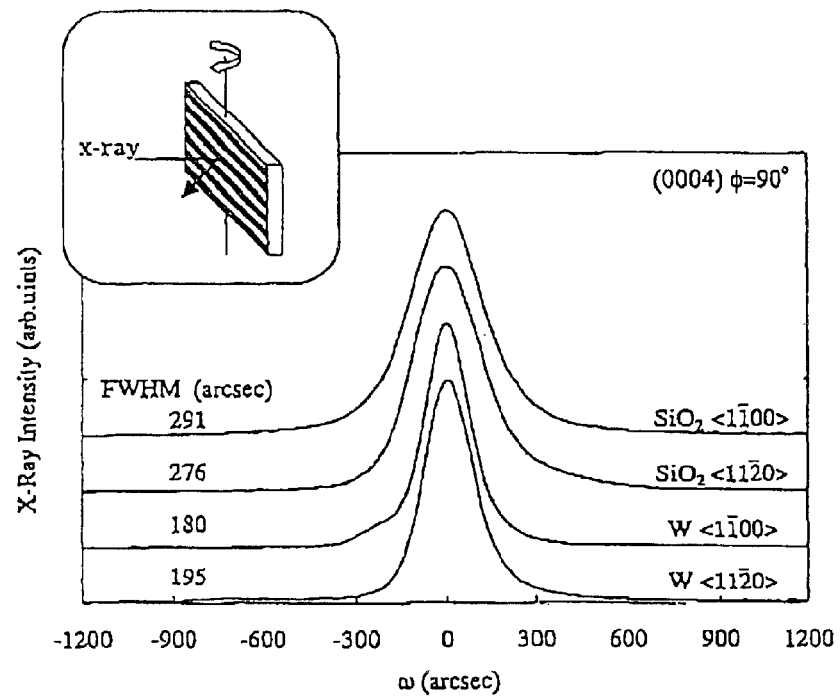
FIGS. 2A and 2B provide a diagram showing X-ray rocking curves for different directions of incidence to the pattern stripe (Parallel-FIG. 2A; Normal-FIG. 2B) in Example 1 and Comparative Example 1.
Figure 2B:
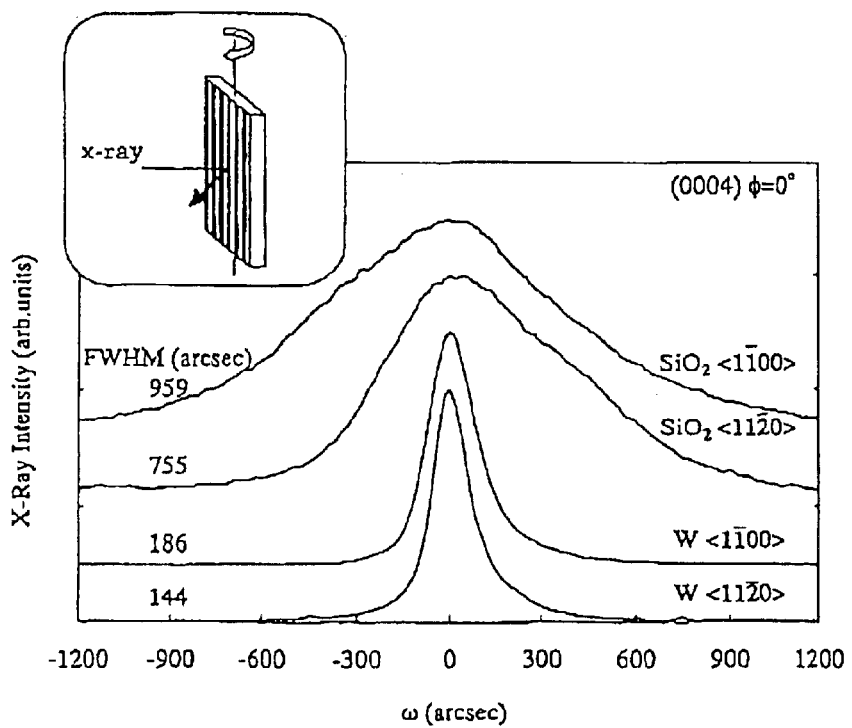

To examine variations in the orientation of the thus obtained crystal, X-ray rocking curves were measured in directions parallel and normal to the stripe direction. FIGS. 2A and 2B show the results. When regrowth was performed on the W pattern; the full width at half maximum of the rocking curve was constant at 200 seconds or less, regardless of the direction of X-ray incidence, and no variations were observed in the crystal orientation. On the other hand, in the case of the $SiO_2$ pattern (Comparative Example), the full width at half maximum of the rocking curve in the direction parallel to the pattern stripe is narrow, but in the direction normal to the stripe, the full width at half maximum increases up to 750 seconds or greater (see FIG. 2B). This means that the crystal regrown on the pattern has variations in crystal orientation relative to the base crystal and the crystallinity is not sufficient compared with the case of the W pattern.

The sample obtained in the first example was cleaved in the direction normal to the pattern, and the cross section was observed under a transmission electron microscope, to confirm that the regrown film was not overgrown over the W pattern.

Example 2

A GaAlN film with reduced defects according to the present invention is formed by regrowth on the pattern having the stripe pattern in the same manner as in the first example. Suitable layers are formed on top of the GaAlN film, and semiconductor processes such as etching and electrode deposition are repeated to obtain electronic devices such as HEMTs (high electron mobility transistors) or FETs (field effect transistors). These electronic devices have excellent electrical characteristics and reliability because the number of crystal defects contained in the crystal functioning as the device is reduced.

Example 3

A GaAlN film with reduced defects according to the present invention is formed by regrowth on the pattern having the stripe pattern in the same manner as in the first example. On top of this GaAlN layer are formed an n-type layer, a layer (light emitting layer) having a smaller band gap than the n-type layer, and ap-type layer, each formed from the compound semiconductor in the order stated, and semiconductor processes such as etching and electrode deposition are repeated to obtain a light emitting device such as a light emitting diode (LED) or a semiconductor laser (LD). These light emitting devices have excellent light emitting characteristics and reliability, especially excellent lift time, because the number of crystal defects contained in the crystal functioning as the device is reduced.

Example 4

GaN was grown to a thickness of 4 μm in the same manner as in the first example, and on top of that, GaAlN was grown.

The AlN composition ratio of this layer was about 15%, and the thickness was 30 nm. On top of this layer was formed a 20-nm thick film of W by electron beam evaporation, and a stripe pattern was formed using conventional photolithography. The stripe direction was <1–100> direction, and the stripe width and stripe spacing were both 5 μm. Next, regrowth was performed using the MOVPE method. The growth pressure was 40 k Pa, and the thickness of the regrown layer was 3 μm. The crystal obtained by the regrowth had a specular surface. The samples obtained in the first and fourth examples were cleaved in the direction normal to the stripe pattern, and their cross sections were observed under a transmission electron microscope; the results showed that while damage was sometimes observed on the base crystal in the sample obtained in the first example, no damage was observed on the base crystal in the sample obtained in the fourth example.

Example 5

GaN was grown to a thickness of 4 μm in the same manner as in the first example. On this base crystal was deposited a film of $SiO_2$ to a thickness of 50 to 70 nm by sputtering, on top of which a film of tungsten (W) was deposited to a thickness of 50 nm by sputtering. Then, using conventional photolithography, a stripe pattern was formed on top of that. The stripe direction was <1–100> and <11–20> directions. Next, regrowth was performed using a low pressure MOVPE method. The thickness of the regrown film was about 8 μm. The sample thus obtained and the sample obtained in the first example were cleaved in the direction normal to the stripe pattern, and their cross sections were observed under a transmission electron microscope; the results showed that while the formation of depressions below the mask was observed on the sample of the first example, the formation of depressions was greatly reduced in the case of the sample obtained in the fifth example.

Example 6

GaN was grown to a thickness of 4 μm in the same manner as in the first example. On this base crystal was deposited a film of tungsten (W) to a thickness of 20 nm by electron beam evaporation method. This sample was kept at 400° C. for 10 minutes in a hydrogen atmosphere, then at 600° C. for 5 minutes in an atmosphere of mixture of hydrogen gas and ammonia gas, then the temperature was raised to 950° C. in an atmosphere of mixture of hydrogen gas and ammonia gas. Then the sample was cooled down immediately. It was recognized by X-ray photoelectron spectroscopy analysis that tungsten nitride was formed uniformly in the tungsten layer. The mask material thus obtained was patterned and regrowth was performed in the same manner as in the first example. A good buried structure as in the first example was formed. For the atmosphere including ammonia for the thermal treatment may also be mixture of ammonia gas and inert gas other than the mixture of ammonia gas and hydrogen gas which was used in the example.

What is claimed is:

1. A III–V compound semiconductor having a first layer that comprises a first III–V compound semiconductor expressed by the general formula $In_u Ga_v AL_w N$ where $0 \leq u \leq 1$, $0 \leq v \leq 1$, $0 \leq w \leq 1$, and $u+v+w=1$, a pattern on said first layer from a material different not only from said first III–V compound semiconductor but also from a second III–V compound semiconductor hereinafter described, and a layer on said first III–V compound semiconductor and said pattern from said second III–V compound semiconductor expressed by the general formula $In_xGa_yAl_zN$ where $0 \leq x \leq 1$, $0 \leq y \leq 1$, $0 \leq z1$, and $x+y+z=1$, wherein the full width at half maximum of the (0004) reflection X-ray rocking curve of said second III–V compound semiconductor is 700 seconds or less regardless of the direction of X-ray incidence, and the compound semiconductor is formed by a vapor phase epitaxy method.

2. A III–V compound semiconductor having a first layer that comprises a first III–V compound semiconductor expressed by the general formula $In_uGa_vAL_wN$ where $0 \leq u \leq 1$, $0 \leq v \leq 1$, $0 \leq w \leq 1$, and $u+v+w=1$, a pattern on said first layer from a material different not only from said first III–V compound semiconductor but also from a second III–V compound semiconductor hereinafter described, and a layer on said first III–V compound semiconductor and said pattern from said second III–V compound semiconductor expressed by the general formula $In_xGa_yAl_zN$ where $0 \leq x \leq 1$, $0 \leq y \leq 1$, $0 \leq z \leq 1$, and $x+y+z=1$, wherein an upper surface of said pattern is not in contact with said second III–V compound semiconductor, and the compound semiconductor is formed by a vapor phase epitaxy method, wherein said pattern is formed from W (tungsten), Re (rhenium), Mo (molybdenum), Cr (chromium), Co (cobalt), Si (silicon), gold, Zr (zirconium), Ta (tantalum), Ti (titanium), Nb (niobium), nickel, platinum, V (vanadium), Hf (hafnium), and pd (palladium), BN (boron nitride), $SiN_x$ (silicon nitride) or tungsten nitride.

3. A III–V compound semiconductor as set forth in claim 1 or 2, wherein said pattern is formed from W or tungsten nitride.

4. A III–V compound semiconductor as set forth in claim 1 or 2, wherein the first III–V compound semiconductor is expressed by the general formula $In_uGa_vAL_wN$ where $0 \leq u \leq 1$, $0 \leq v \leq 1$, $0.01 \leq w \leq 1$, and $u+v+w=1$.

5. A III–V compound semiconductor as set forth in claim 1 or 2, wherein said pattern is a lamination comprising at least two layers which are contacting each other and made of different materials.

6. A III–V compound semiconductor as set forth in claim 1 or 2, wherein said pattern is a lamination comprising at least a layer made of W and a layer made of a material other than W.

7. A III–V compound semiconductor as set forth in claim 5, wherein said pattern is a lamination comprising at least a layer made of W and a layer made of $SiO_2$.

8. An electronic device comprising the III–V compound semiconductor as set forth in claim 1 or 2.

9. A light emitting device comprising the III–V compound semiconductor as set forth in claim 1 or 2.

10. A method of making a III–V compound semiconductor comprising:

forming a layer from a first III–V compound semiconductor expressed by the general formula $In_uGa_vAL_wN$ where $0 \leq u \leq 1$, $0 \leq v \leq 1$, $0 \leq w \leq 1$, and $u+v+w=1$, forming a pattern on said layer from a material different not only from said first III–V compound semiconductor but also from a second III–V compound semiconductor, forming a layer on said first III–V compound semiconductor wherein said pattern from said second III–V compound semiconductor satisfies the general formula $In_xGa_yAl_zN$ where $0 \leq x \leq 1$, $0 \leq y \leq 1$, $0 \leq z \leq 1$, and $x+y+z=1$, wherein the full width at half maximum of the (0004) reflection X-ray rocking curve of said second III–V compound semiconductor is 700 seconds or less regardless of the direction of X-ray incidence, wherein the III–V compound semiconductor is formed by a vapor phase epitaxy method.

* * * * *